United States Patent [19]

Campbell

[11] 4,328,541
[45] May 4, 1982

[54] FAIL-SAFE DIGITAL COMPARATOR
[75] Inventor: Richard D. Campbell, Swissvale, Pa.
[73] Assignee: American Standard Inc., Swissvale, Pa.
[21] Appl. No.: 152,884
[22] Filed: May 23, 1980
[51] Int. Cl.³ ............................................. G06F 7/04
[52] U.S. Cl. ............................................. 340/146.2
[58] Field of Search .................... 340/146.2; 307/311; 250/551

[56] References Cited
U.S. PATENT DOCUMENTS 3,508,198 4/1970 Coombs, Jr. et al. ............ 340/146.2
3,517,175 6/1970 Williams ............................ 340/146.2
3,983,329 9/1976 Rock ............................. 340/146.2 X
3,995,173 11/1976 Sibley .................................. 307/218
4,012,714 3/1977 Lohmann ......................... 340/146.2
4,017,830 4/1977 Shigemori et al. ............... 340/146.2
4,079,272 3/1978 Howatt ............................... 307/311
4,179,629 12/1979 Sahasrabudhe et al. ............ 307/311

Primary Examiner—David H. Malzahn
Attorney, Agent, or Firm—A. G. Williamson, Jr.

[57] ABSTRACT

A digital comparator with a comparison cell for each pair of digits of two words stored in separate register banks. Each corresponding pair of register stages is coupled to the associated comparator cell by a rectifier interface network which supplies an actuating signal only when the associated word digits have complementary characteristics. The comparator cells are coupled in series and interfaced to input and output by optical coupler units. Each cell includes an LC network tuned to the selected frequency of an input test signal which is passed through the comparator chain, from highest to lowest order cells, only if each cell is actuated by an input signal from the associated interface network, thus indicating that each pair of word digits is complementary.

12 Claims, 5 Drawing Figures

FAIL-SAFE DIGITAL COMPARATOR

BACKGROUND OF THE INVENTION

My invention pertains to a fail-safe digital comparator. More specifically, the invention relates to a digital comparator arrangement for making a vital comparison between a digital word supplied broadside from one digital device and a complementary word supplied broadside from a second digital device.

There are many occasions when a pair of digital words must be compared to determine or check the correct transmission and/or reception of one or both words. Each of these words consists of a plurality of bits and is stored in one of two register devices with equal numbers of stages, that is, register devices in which each word may be stored in parallel or broadside format. A comparison can then be made by a device having a plurality of cells equal to the number of bits in a word, arranged so that the cells are appropriately controlled broadside by the two storage registers. Passage of a signal through all the cells serially is then a test that the two words are identical. In nonvital applications, each cell, for example, may be an exclusive OR element which receives an input from the corresponding bit storage stage in each word register. In this conventional apparatus, the outputs from all the exclusive OR elements are combined in a NOR circuit which supplies a final output indicating the comparison or noncomparison of the two words. The correct output occurs when the first word is identical to the second word. However, such arrangements are not vital, that is, are not fail-safe. For example, a pair of corresponding bits may both be zero and thus neither delivers any voltage to the comparator cell. This case is indistinguishable from the fault situation when one or both bit wires become disconnected from the comparator. A remedy to assure fail-safeness is to compare a first word with a complementary second word. Now a valid comparison requires that current shall flow from a bit output of one register, through the comparator cell, and into the bit output of the other register. If the comparator uses this current flow as its power supply, then a valid output indication guarantees that the wiring is intact.

Accordingly, an object of my invention is a vital digital comparator apparatus for checking the equivalence of two digital words.

Another object of the invention is vital digital comparator apparatus for comparing a digital word with its complementary digital word.

A further object of my invention is a digital comparator comprising a plurality of active cells coupled in series by optical isolator devices, which produces an output signal at the final cell, in response to an input test signal of selected characteristics applied at the initial cell, only when an actuating input is applied to each cell indicating the complementary characteristics of a pair of digital signals.

Another object of the invention is a cell element for a vital digital comparator which is coupled to the preceding and succeeding cells in a series chain by optical isolator devices and is responsive to pass a test signal between the adjacent cells only when an applied actuating signal indicates that a pair of associated digits being compared have complementary characteristics.

A still further object of the invention is a vital digital comparator, for comparing two digital words, which includes a plurality of comparator cells, one for each word digit and coupled in series by optical isolator devices, each cell receiving a rectified input when the two corresponding word digits are complementary and responsive only to such input to pass a selected signal applied to the initial cell of the comparator series.

Also an object of my invention is a vital digital comparator including a plurality of comparator cells, one for each corresponding pair of digits of two words being compared and coupled in series by optical isolator elements, each cell responsive only to a rectified input signal indicating the complementary relationship of the corresponding pair of word digits, to successively pass a test signal applied at the series input to a final output to indicate the equivalence of the two registered words.

Yet another object of my invention is a vital arrangement for comparing the equivalence of two digital words, including a storage means for each word with a storage element for each digit and a vital comparator means including a cell for each corresponding pair of word digits, these cells coupled in series by optical elements and each responsive only to an actuating input indicating a complementary relationship between the corresponding digits for passing a selected test signal from the preceding cell to the succeeding cell, the vital comparator providing an output indicating word equivalence only when each cell is conditioned to pass the selected test signal.

Other objects, features, and advantages of my invention will be apparent from the following specification and appended claims when taken in connection with the accompanying drawings.

SUMMARY OF THE INVENTION

According to my invention, two digital words to be compared are stored in parallel format in separate digital registry banks, that is, with a register stage for each digit so that all digits of the word are stored simultaneously. The pair of digits stored in corresponding stages of each register is then compared in an associated cell of a multistage comparator having one cell for each digit. In order to allow vital checking, because it is unsafe to compare signals of equal level and of the same polarity, the second word is stored in its complementary form. Since it is also not possible to design a transistor circuit which will work on either polarity of power supply voltage, the signals representing the digit value stored in each stage of the corresponding pairs are applied to the opposite inputs of a separate, full-wave rectifier element. This produces an output voltage signal, always of the same polarity, from the interfacing rectifier only when the inputs from the registry stages are opposite, that is, are complements of each other. In this specific showing, interface gates or buffers are interposed between each register stage and the full-wave bridge rectifier. The output of each bridge rectifier is applied as an actuating input signal to the associated comparator cell.

The comparator stages or cells are coupled in series from the highest order digit to the lowest order by optical couplers or isolators. An input test signal of a selected frequency generated by an oscillator or other generator device, is applied through a similar optical coupling element to the highest order cell of the comparator. Each optical coupler includes a light-emitting diode (LED) which functions as a level detector, a light-responsive diode actuated by the output of the LED, and a transistor amplifier, powered by the actuating signal, which amplifies the test signal when both test and actuating signals are present. The amplifier output is passed by a tuned circuit to the LED in the next optical coupler. If each pair of corresponding digits is complementary, so that an actuating signal is supplied to each comparator cell, the alternating current test signal is passed through the comparator cell-by-cell to an output optical coupler element similar to these coupling adjacent cells. This provides a buffer between the final cell and the actual comparator output terminal. The presence of an output signal indicates that the registered digital words are complementary which assures the correct reception or registration of the transmitted words. Conversely, the absence of an output signal indicates a fault or error in word structure, its transmission or reception, or an apparatus fault or failure.

BRIEF DESCRIPTION OF THE DRAWINGS

Prior to defining the invention in the appended claims, I will describe a specific and preferred embodiment as shown in the accompanying drawings, in which:

Figure 1:
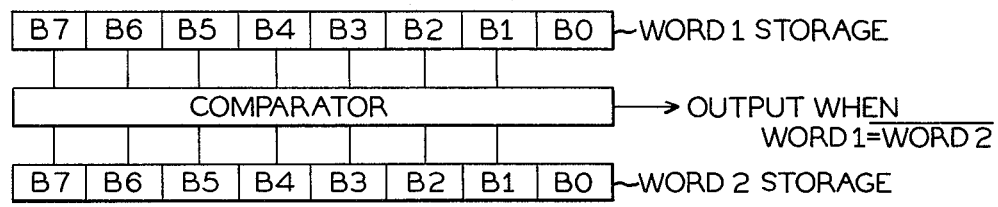
FIG. 1 is a conventional block diagram illustrating the general principle of the disclosed invention.

In each of the drawing figures, similar reference characters designate the same or similar elements of the arrangement. The operation of the interface circuits requires two levels of direct current operating voltage for bias and operational signals. Connections to the positive terminal of the higher operational voltage source is designated by the reference 1B while connections to the positive terminal of the lower or bias voltage source is designated by the reference 2B. A common negative connection to these sources is shown by conventional ground symbol. As a specific example, the voltage level of the positive terminals 1B and 2B may be on the order of 12 to 15 volts and 5 volts above the ground level, respectively.

DESCRIPTION OF THE ILLUSTRATED EMBODIMENT

Figure 2:
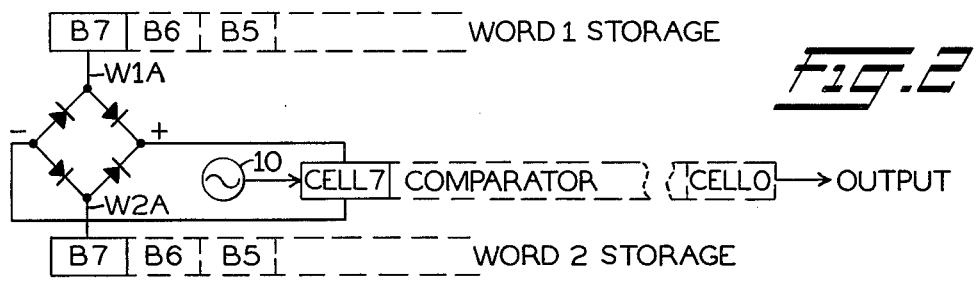
FIG. 2 is an expanded block and schematic diagram illustrating in a conventional manner a specific arrangement embodying the invention.

The block diagram of FIG. 1 illustrates in a conventional manner the basic or general principle of a vital digital comparator embodying my invention. The upper and lower chain of adjacent blocks represent digital word storages, that is, register devices with a register or storage stage for each digit of the stored word. Each such stage is designated by the reference B (bit) with a suffix representing the digit sequence, that is, 0 to 7 in ascending order of significant value of the stored digit. The comparator device shown by a rectangular block has an equal number of stages, or cells as they will be hereinafter designated as more specifically shown in FIG. 2. Each such comparator cell receives an actuating input from the corresponding stage of each word register. These actuating inputs constitute the power supply for the amplifying portion of each comparator cell. Thus if bit 0 of register 1 is 1 (12 volts for example) and bit 0 of register 2 is a 0 (0 volts for example), there is then a net 12 volts available as power supply voltage for comparator cell 0. If both inputs had been 1, then there would have been no net power supply voltage for cell 0. Similarly, if both inputs had been 0, then there would have been no net power supply voltage for cell 0. Thus, this vital design requires that opposite actuating inputs be received by the comparator cells from the word registers and power is drawn from these actuating inputs by the active elements in each comparator cell. Thus, an output from the comparator at the lowest order cell is produced only when word 2 is the complement of word 1, as indicated by the note at the right of the block diagram of FIG. 1.

However, it is not possible to design a transistorized comparator cell which will work equally well with an actuating input signal of either polarity. A solution, shown conventionally in the schematic diagram of FIG. 2, consists of applying the registry stage signals from each storage bank through a full-wave bridge rectifier to each comparator cell. In other words, the register stages are interfaced into the comparator cell by a rectifier element so that the actuating voltage, regardless of which storage cell provides the positive signal, is always of the same polarity as applied to the comparator cell. Only a single interface element is schematically shown in this drawing figure, that between register stages B7 and comparator cell 7. Specifically, the signals W1A and W2A, representing the characteristics of the word bits stored in the associated pair of B7 register stages, are applied to the opposite inputs of a diode or rectifier bridge element. If these inputs are of opposite polarity, i.e., + and −, the rectifier bridge produces an output which is applied to cell 7 of the comparator. It is to be noted that the associated pair of bits from stages B7 must be complementary but that either may have the 1 characteristic and the other 0, in order for the bridge rectifier to deliver an output. If the two bits are the same, that is, both are 1 or both are 0, the rectifier will produce no output for application to the comparator cell.

An alternating current signal of selected frequency, from a conventionally shown generator device 10, is supplied to the comparator, specifically into the cell comparing the most significant bits of the words. The cells are then coupled in series to pass this alternating current signal to the output only if each corresponding pair of word bits is complementary.

Figure 3:
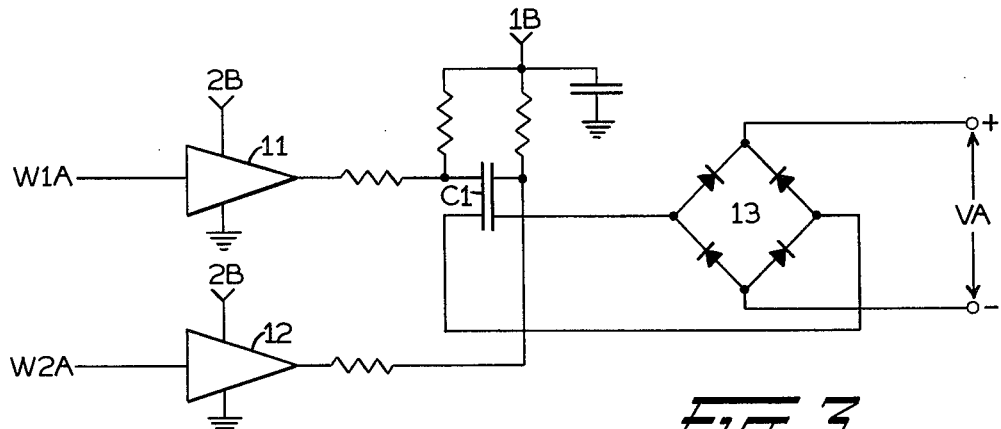
FIG. 3 is a schematic circuit diagram of a specific interface circuit arrangement between a pair of word register stages and the associated comparator cell, shown conventionally in FIG. 2, which supplies the actuating signal to the comparator cell.

A specific interface circuit arrangement with a bridge rectifier is shown in FIG. 3. For coordination with other drawing figures, this interface circuit is assumed to be that interfacing or coupling storage stages B7 with cell 7 of the comparator element. Signals from the register stages B7, designated as signals W1A and W2A with the suffix A designating the stage 7 level, are each applied through separate active buffer units 11 and 12, respectively, illustrated for convenience as active amplifier elements. It is noted that energy for operation of the buffer elements is supplied from the 2B terminal of the direct current source. The outputs of buffer amplifiers 11 and 12 are applied to opposite input terminals of the bridge rectifier 13 through the opposing plates of a four-terminal bypass capacitor C1. Each input signal is combined with a voltage signal from the source terminal 1B. An output voltage signal VA is produced from rectifier bridge 13 if input signals W1A and W2A have opposite characteristics, i.e., are complements. It is to be noted that, for convenience, the output signals are distinguished by the letter suffixes A, B, C, etc., corresponding to the associated pairs of storage stages B7, B6, B5, etc., in descending order.

Figure 4:
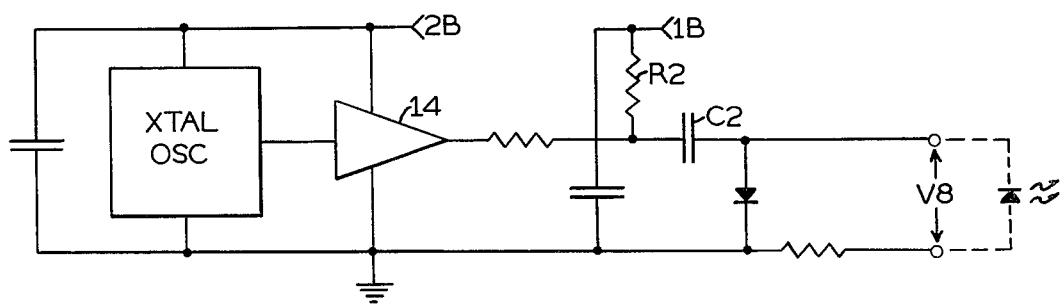
FIG. 4 is a schematic circuit diagram of a specific test signal generator for the comparator conventionally illustrated in FIG. 2.

A specific circuit arrangement to generate the alternating current test signal for the comparator is shown in FIG. 4. A crystal oscillator unit or device, illustrated by the conventional block designated XTAL OSC and having a preselected frequency, is used to establish the frequency level which, for example, may be on the order of 100 to 200 KHz. In any particular installation, the crystal oscillator frequency will be specifically selected to avoid any possible interference from any alternating current source involved in the generation or transmission of the digital words being compared. The output of the oscillator is applied through a buffer 14, shown for convenience as a simple amplifier element, and a capacitor C2. This capacitor is charged from source terminal 1B through a resistor R2 and is then dumped by buffer 14 into the light-emitting diode of the first comparator cell, as will be explained shortly. This voltage so transferred is designated as signal V8. It may be noted that crystal oscillator and accompanying buffer element 14 are energized from terminal 2B of the source.

Figure 5:
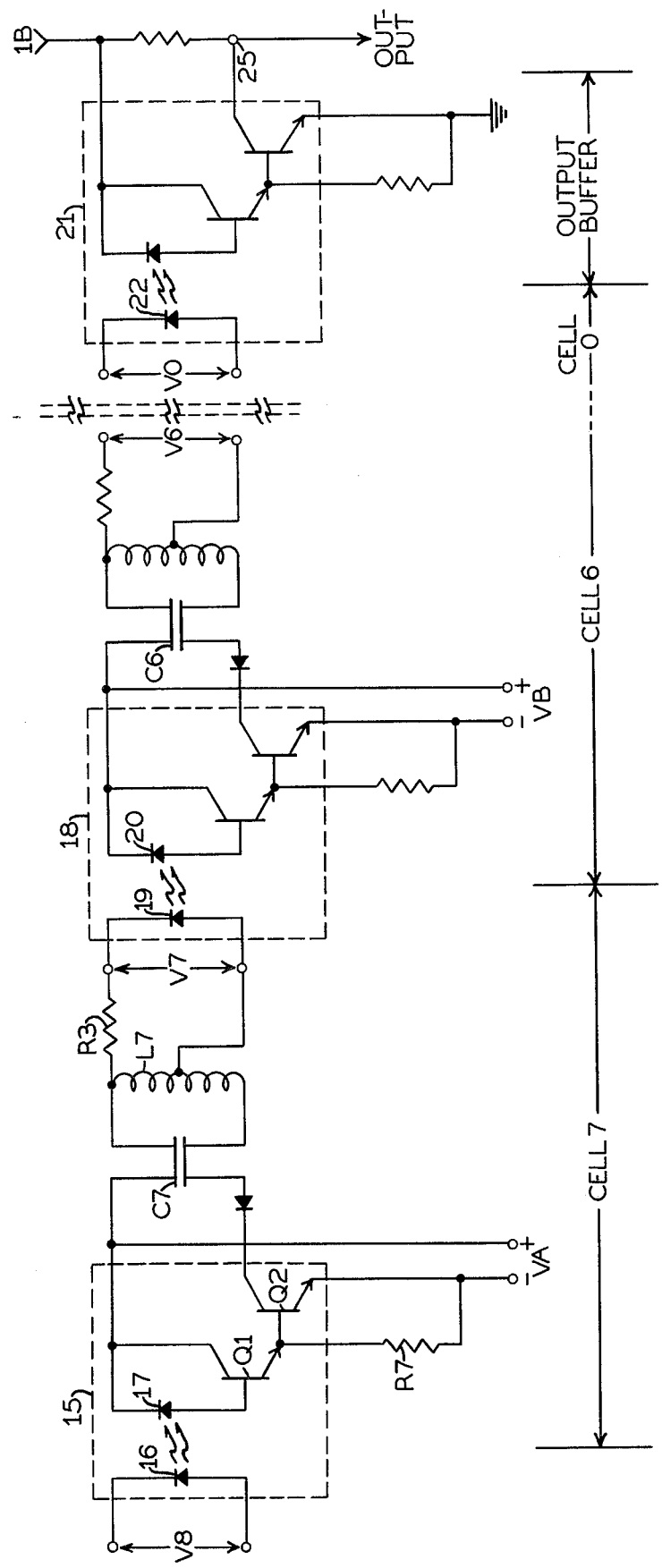
FIG. 5 is a schematic circuit diagram of the first two coupled cells of the comparator chain and the output buffer element schematically coupled to the final cell.

The circuit arrangement for a portion of the comparator unit is shown in FIG. 5. Illustrated are the cells for comparing the two highest or most significant digits of the words being compared, designated as cells 7 and 6 in descending order. To illustrate the output arrangement, the circuit network for cell 6 is blended into the final element of the lowest order cell 0 which compares the bits representing the least significant digit of the words. The terminals for receiving the input or test signal V8 from the alternating current source of FIG. 4 are shown at the left of the drawing while at the right is an output buffer element 21 and an output terminal 25. The adjacent cells of the comparator are coupled by optical coupler or isolator devices. In addition, similar devices are used for coupling the input from the oscillator or AC generator and as the final output buffer. Preferably these couplers are integrated circuit elements designated by the dashed blocks 15, 18, and 21 as examples. A specific internal circuitry represented by such coupler elements is shown within each conventional dashed block to enable a more complete understanding of the invention. Referring to block 15, it may be seen that it includes a light-emitting diode (LED) and an associated light-responsive diode 17, the latter element being positioned to be activated by light emitted by LED 16. The internal circuits further include transistors Q1 and Q2 in Darlington connection and normally in a nonconducting condition.

Cell 7 further includes a tuned circuit comprising a four-terminal capacitor C7 and an inductor winding L7 which have values to tune the network to the frequency of the alternating current test signal. The output voltage signal from the associated FIG. 3 interface arrangement, responsive to the character of the word bits registered in stages B7 of the storage elements, is applied at the input terminals VA with the polarity as shown. Corresponding input signals from the lesser order interface networks are applied to similar input terminals for the lower order comparator cells, for example, the terminals VB of the illustrated cell 6.

The LED of each coupler receives the output of the preceding comparator cell or other circuit element. For example, output signal V7 of cell 7 is applied to LED 19 of coupler 18 to transfer the signal into the network of cell 6. Another example is the application of output signal V8 from the oscillator unit of FIG. 4 to LED 16 in order that the alternating current test signal may be fed into the comparator network. These LED elements serve as level detectors of the input signal for each cell. Such diodes have a threshold voltage level below which there is no conduction and therefore no light. Specifically, as an example, input alternating voltage signals of less than two volts peak-to-peak will normally produce no output from the LED. There is, of course, no collector electrode to contribute leakage current. Furthermore, the circuitry is arranged in a vital manner so that any high resistance connections inadvertently developing in the circuits to the LED cause the elements to be reverse-biased by the direct current supply voltage.

Each LED responds only to positive half-cycles of the applied voltage. In other words, LED 16 emits a pulse of light only during the half-cycles of the alternating voltage signal V8 from the oscillator element which have the proper polarity to cause current to flow in the low resistance or conducting direction through diode 16. The resulting current pulses may be as short in duration as one microsecond. When light-responsive diode 17 is actuated by each pulse of light with signal VA present, transistors Q1 and Q2 become conducting with transistor Q2 being in its saturated condition. A pulsating current thus flows from the signal source terminals VA through the circuit network including the upper plate of capacitor C7, inductor L7, lower plate of capacitor C7, and the collector-to-emitter circuit path of transistor Q2. This current flow produces an alternating current voltage output signal V7 across LED 19 of coupler 18. Resistor R7 connected between the base and emitter of transistor Q2 reduces the gain and widens the band width of the coupler element. The diode in series with the collector of transistor Q2 prevents this transistor from receiving reverse collector-to-emitter voltages from the ringing of the tuned circuit network. It will be noted that the direct current path traced from the positive terminal VA through four-terminal capacitor C7 and resistor R3 applies the wrong polarity to LED 19 to cause forward conduction. Rather this LED is turned on, that is, emits pulses of light, only from the flyback energy in the tuned circuit (L7, C7) resulting from the periodic pulses of energy flowing from terminals VA as transistor Q2 periodically conducts at the frequency of the input test signal V8.

Thus, if each interface input corresponding to signals VA and VB is active, i.e., supplies a voltage signal because the corresponding pair of word digits is complementary, the test signal V8 is passed serially through comparator cells 7 to 0, inclusive. The output signal VO from cell 0 is then applied to the output buffer or coupler unit, specifically to LED 22, so that a pulsating output signal is produced at terminal 25. If any one of the interface input signals V is absent, due to the corresponding pair of word bits having the same characteristic, the passage of the test signal through the comparator cells is interrupted. No output appears then at terminal 25 which indicates that the registered words are not complementary. It may be noted that the absence of any input signal V due to a fault or open circuit also results in a noncomparison output indication. Further, any element failure within the comparator chain or the reverse polarity of an input signal likewise interrupts the passage of the input signal V8 so that a noncomparison output indication results at terminal 25.

The circuit arrangement of my invention thus provides a vital digital comparator. The apparatus assures the safe and accurate comparison of complementary digital words where equivalence of the stored words is vital to the operation of the complete system. This is accomplished by an arrangement using readily available circuit elements. In other words, an efficient and economical vital digital comparator apparatus is produced.

Although I have herein shown and described but one specific arrangement of a vital digital comparator embodying the invention, it is to be understood that various changes and modifications within the scope of the appended claims may be made without departing from the spirit and scope of my invention.

Having thus described the invention, what I claim as new and desire to secure by Letters Patent, is:

1. A vital digital comparator arrangement, comprising,
    (a) a pair of digital word register means, each having the same number of storage stages for separately storing in parallel format a multi-digit word,
    (b) a comparator means including a plurality of comparator cells, one associated with each corresponding pair of register storage stages and optically coupled in a series chain for at times passing a test signal of preselected characteristic through said chain from highest to lowest order cell,
    (c) generator means operable for producing said test signal of preselected characteristic and coupled for applying that signal to said highest order comparator cell, and
    (d) a separate interface element coupled to each corresponding pair of storage stages for producing an actuating signal only when the stored word digits are complementary,
    (e) each interface element further coupled for actuating the associated comparator cell to pass a signal of said preselected characteristic only when an interface actuating signal and said test signal are present, whereby only the presence of a preselected characteristic output signal from the lowest order comparator cell indicates that the words stored in said pair of register means are complementary.

2. A digital comparator arrangement as defined in claim 1 in which,
    (a) said preselected characteristic of the test signal is a preselected frequency,
and in which each comparator cell comprises,
    (b) an optical isolator device coupled to the next preceding cell in said series chain for at times receiving a test signal of said preselected frequency, and
    (c) a tuned circuit network coupled to the associated optical isolator device and responsive to a signal having said preselected frequency for applying an equivalent signal to the optical isolator device associated with the next succeeding comparator cell in said series chain,
    (d) said associated interface element being coupled to both the optical isolator device and the tuned network for actuating the passage of said test signal when the corresponding stored digits are complementary.

3. A digital comparator arrangement as defined in claim 2 in which,
    (a) said generator means is coupled by the optical isolator device of the highest order comparator cell for supplying said preselected frequency test signal to said highest order cell,
and which further includes,
    (b) another optical isolator device coupled to the tuned circuit network of the lowest order comparator cell for passing the output of that cell as an indication signal that fully complementary words are stored in said register means.

4. A digital comparator arrangement as defined in claim 3 in which,
    (a) each interface element includes a full-wave rectifier element coupled to the corresponding pair of register stages and responsive only to complementary digit signals for producing said actuating signal, and
    (b) each rectifier element is further coupled to the associated comparator cell for actuating the passage of said test signal only when an actuating signal is produced.

5. A digital comparator arrangement as defined in claim 4 in which each optical isolator device comprises,
    (a) a light-emitting means coupled to receive said preselected frequency signal from the preceding network and responsive thereto for suppling pulses of light at that frequency,
    (b) a light-responsive circuit means electrically isolated from but positioned to be activated into conduction by pulses of light from the associated light-emitting means, and
    (c) a transistor network coupled to the light-responsive circuit means and associated interface rectifier element and responsive to each periodic conducting condition of said light-responsive circuit means and an actuating signal from the associated interface rectifier element for applying the test signal to the associated tuned circuit network to produce an output signal from that cell at said preselected frequency.

6. A digital comparator arrangement as defined in claim 5 in which,
said transistor network is a Darlington connection amplifier powered by the actuating signal from the associated interface rectifier element for passing a preselected test signal from the associated light-responsive circuit means to the associated tuned circuit network.

7. A digital comparator arrangement as defined in claim 6 in which,
    (a) each light-emitting means is a light-emitting diode, and
    (b) each light-responsive circuit means is a light-responsive diode.

8. Vital comparator apparatus for comparing two digital signals, comprising,
    (a) a first source supplying a test signal having a preselected frequency,
    (b) a second source supplying said two signals to be compared,
    (c) an optical isolator element coupled to said first source for at times receiving said test signal,
    (d) an interface network coupled to said second source for receiving said two digital signals and responsive thereto for producing an actuating signal only when a predetermined relationship exists between the digital signals being compared, (e) a circuit network tuned to said preselected frequency of said test signal and coupled to said interface network for receiving said actuating signal when produced, (f) said optical isolator element further coupled to said interface network for modulating, at said preselected frequency, any actuating signal applied to said tuned circuit network, only when said test signal is received, and (g) an output means coupled to said tuned circuit network for supplying an output signal of said preselected frequency only when said tuned circuit network responds to a modulated actuating signal indicating the existence of said predetermined relationship between said two digital signals.

9. Vital comparator apparatus as defined in claim 8 in which said optical isolator element comprises, (a) a light-emitting diode coupled to said first source and responsive to said test signal for producing pulses of light at said preselected frequency, (b) a light-responsive diode electrically isolated from, but positioned to be activated into conduction by each pulse of light produced by, said light-emiting diode, and (c) a Darlington connected transistor network coupled to said light-responsive diode and said interface network and responsive to periodic conduction of said light-responsive diode and the presence of an actuating signal for applying a signal modulated at said preselected frequency to said tuned circuit network, and in which, (d) said tuned circuit network is responsive only to a modulated signal for producing an output indicative of the existence of said predetermined relationship between the two digits compared.

10. Vital comparator apparatus as defined in claim 9 in which, (a) said actuating signal is produced by said interface network only when said two compared digits have complementary characteristics.

11. Vital comparator apparatus as defined in claim 10 in which said tuned circuit network comprises, (a) an inductor winding with a predetermined tap serving as an autotransformer secondary winding, (b) a four-terminal capacitor connected in parallel with said inductor winding for turning the network at said preselected frequency, (c) said capacitor-inductor parallel network coupled in a series circuit with said interface network and controlled by said transistor network for modulating an actuating signal at said preselected frequency when a test signal is received, and in which, (d) said output means is coupled to said autotransformer secondary winding for producing a preselected frequency output signal only when a test signal and an actuating signal are both received.

12. Vital comparator apparatus as defined in claim 11 in which, (a) said first source is the output means of a preceding comparator apparatus in a series chain of such apparatus, (b) the corresponding output means is coupled to the optical isolator element of a succeeding comparator apparatus in said series chain, and (c) said second source is the equivalent storage stages in a pair of multi-digit word registers which store separate words to be compared.

* * * * *